(12) United States Patent
Chow

(10) Patent No.: US 8,368,024 B2
(45) Date of Patent: Feb. 5, 2013

(54) SYSTEM AND METHOD FOR ATTENUATION OF ELECTRICAL NOISE

(76) Inventor: Vincent Y. Chow, Hanover Park, IL (US)

( * ) Notice: Subject to any disclaimer, the term of this patent is extended or adjusted under 35 U.S.C. 154(b) by 529 days.

(21) Appl. No.: 12/686,665

(22) Filed: Jan. 13, 2010

(65) Prior Publication Data

US 2010/0117722 A1 May 13, 2010

Related U.S. Application Data

(63) Continuation-in-part of application No. PCT/US2008/069612, filed on Jul. 10, 2008.

(60) Provisional application No. 60/949,743, filed on Jul. 13, 2007.

(51) Int. Cl.
*G01J 5/20* (2006.01)

(52) U.S. Cl. ........................ 250/338.3; 398/49

(58) Field of Classification Search ............. 250/208.1, 250/338.3, 349; 398/49
See application file for complete search history.

(56) References Cited

U.S. PATENT DOCUMENTS

| | | | | | |
|---|---|---|---|---|---|
| 4,172,666 | A | * | 10/1979 | Clarke | 356/431 |
| 4,697,081 | A | * | 9/1987 | Baker | 250/338.3 |
| 4,799,243 | A | * | 1/1989 | Zepke | 377/6 |
| 4,864,136 | A | * | 9/1989 | Behlke | 250/338.3 |
| 5,418,359 | A | * | 5/1995 | Juds et al. | 250/221 |
| 6,201,234 | B1 | | 3/2001 | Chow et al. | |
| 7,130,254 | B2 | * | 10/2006 | Kaaden | 369/47.5 |
| 7,503,706 | B2 | * | 3/2009 | Wipiejewski et al. | 385/89 |
| 7,826,873 | B2 | * | 11/2010 | Telefus | 455/573 |
| 2004/0105364 | A1 | | 6/2004 | Chow et al. | |

OTHER PUBLICATIONS

International Search Report for PCT/US2008/069612, mailed Sep. 24, 2008.

* cited by examiner

*Primary Examiner* — Seung C Sohn
(74) *Attorney, Agent, or Firm* — Dykema Gossett PLLC

(57) ABSTRACT

The Present Invention relates to methods and systems particularly useful in electrical products used to monitor and detect very weak signals. These products include, for example, night vision binoculars and remote listening devices. More specifically, the methods and systems of the Present Invention provide a signal conditioning technique that attenuates electrical noise generated within the product while at the same time preserving the integrity of the input signal. This provides a high signal-to-noise ratio within the product electronics and a dramatically clear final image. The Present Invention includes a method and system for chopping or splitting an input signal into two components, tagging each of the split signal components with opposite polarities, and a second reverse chopping step that combines the split and tagged input signal components into a restored input signal. The combining step, in addition to restoring the original input signal, cancels and attenuates internally generated, and untagged, electronic noise, providing image quality and detection in an efficient and economical manner that could not be obtained in the past.

25 Claims, 5 Drawing Sheets

US 8,368,024 B2

SYSTEM AND METHOD FOR ATTENUATION OF ELECTRICAL NOISE

CROSS-REFERENCE TO RELATED APPLICATIONS

This application is a continuation-in-part of international application no. PCT/US2008/069612, filed 10 Jul. 2008 and published in English on 22 Jan. 2009 under international publication no. WO 2009/012106 (the '612 application), which claims the benefit of U.S. provisional application No. 60/949,743 filed 13 Jul. 2007 (the '743 application). The '612 application and '743 application are both hereby incorporated by reference as though fully set forth herein.

This Invention was developed with Government support under HQ0006-07-C-7776 awarded by the Missile Defense Agency. The Government may have certain rights in the invention.

FIELD OF THE PRESENT INVENTION

The Present Invention relates to electronic methods and systems for the high quality detection and monitoring of very weak signals. More particularly, the Present Invention relates to a signal conditioning method and apparatus for suppressing or attenuating electrical noise while maintaining the strength and integrity of the input signal coming from the object being detected and viewed.

BACKGROUND OF THE PRESENT INVENTION

There are many currently-known electrical products generally designed to detect or monitor a weak signal, whether the signal is visual or optical, magnetic, auditory, pressure-based or any other sensory measurement. These products include, for example, night vision binoculars, camera systems designed to detect images in sub-optimal conditions and listening devices designed to detect weak or distant sounds. In each of these products (along with similar-use products), the quality of the final or target image depends not only upon the strength and quality of the signal coming from the target or object being detected, but also the ability to minimize the random "noise" generated in the electronics of the monitoring device. In an optical system, for example, this noise may be "dark current noise," which includes what is referred to as 1/f noise, thermal noise from the photodetector and the preamplifier (known as "Johnson noise") and noise caused when voltage is applied to the photodetector (known as "shot noise"). The greater the random noise inside a product is compared to the strength of the target signal, the poorer the quality of the final target image. If the internal noise is significant compared to the target signal, whether it is because the magnitude of the noise is so great or the strength of the target signal is very weak, it will detract from or blur the image within the system. And if the signal is weak and there is a lot of noise in the system, the final image can be completely hidden or obliterated.

The ratio of signal strength to the strength of electronic noise is referred to as the "signal-to-noise" ratio: The stronger the signal, the lower the noise; or, the higher the signal-to-noise ratio, the better is the quality of the image being shown. Currently-known products require that an input signal (e.g., light, magnetic field, vibration, sound, heat, pressure, etc.) being sensed by an appropriate detector must have a signal strength greater than the electrical noise (primarily coming from the detector and preamplifier in the system) of the input stage before it can be reliably detected and viewed. This means that the signal-to-noise ratio must be greater than 1.0 before sensing is possible.

There exists several currently-known ways, or techniques, to improve the signal-to-noise ratio in an effort to keep it greater than 1.0. These techniques include: (1) amplifying the input signal and (2) filtering out the noise. Both of these techniques, however, require knowledge of the input signal in advance, or some way to identify the signal. That is, with regard to the former technique, the input signal must be known or identifiable in order to amplify it without amplifying the electronic noise that surrounds it, and with regard to the latter, the input signal must also be known in order to distinguish it from the noise that is being blocked by the filter.

Currently-known methods for identifying an input or target signal include: (a) knowing the type of signal in advance; (b) having control over the input signal and coding it when it is transmitted, such as with signal modulation schemes; or (c) time-averaging techniques to detect repeating signals and distinguish them from non-repeating random noise. Obviously, if the signal to be detected is not known or controlled in advance, none of the above techniques, other than time-averaging, can be used.

However, even if used, time-averaging techniques are limited and impractical because time-averaging, in general, is a relatively slow process requiring many samples to effectively reduce the noise that exists. Finally, none of the currently-known techniques, including time-averaging, are effective for detecting short duration or transient images where there is insufficient data to analyze the signal.

The Present Invention overcomes the aforementioned shortcomings of the currently-known techniques, and provides drastically improved signal-to-noise ratios even in those situations where creation of the input signal is not controlled, where the input signal is not known, and in situations where the target signal is very weak compared to a strong background signal. In particular, the Present Invention allows one to place "tags," or codes, on the input signal, when the input or target signal is not known in advance and no control over transmission of the target signal is available, such that background signals and noise can be effectively attenuated and filtered, while maintaining the integrity of the target signal. This provides a high signal-to-noise ratio and the detection of signals in a manner and having a quality that has heretofore never been obtainable.

SUMMARY OF THE PRESENT INVENTION

The Present Invention generally provides a method and system to attenuate electrical noise and background in a monitoring or detecting product, thereby being able to clearly reproduce and illustrate weak target input signals. Background signals in embodiments of the Present Invention are suppressed by what is referred to as "common mode rejection" techniques, that is, by techniques that cancel common mode signals and, here, that cancel common background noise. This noise attenuation is accomplished in the detector and preamplifier stage of a detector system, where significant noise is typically generated. Noise attenuation in embodiments of the Present Invention can be accomplished, and can provide enhanced images, where the target input signal is unknown, is of a transient nature or where there is very little data available to analyze the signal.

Following the teaching of the Present Invention, the target input signal (which can be any type of input, such as an optical signal or one of vibration, magnetic field, sound, heat, pressure, etc.) is split into two components, preferably through a process called "dither chopping" Each of the two components is then coded, or "tagged," with a unique marker as the input signal components are converted into an electrical format. The unique encoding technique of the Present Invention maintains full view of the input scene and does not have scene blindness problems caused by physical light shutters used in lock-in and synchronous detection systems. As a consequence, the noise reduction technology in the detection circuit of embodiments of the Present Invention do not suffer from a 50% loss in input signal strength occurring in current "chopper" based systems (e.g., having a physical input shutter), and, therefore, have up to twice the detection sensitivity. Significantly, the random noise, containing white noise and non-white noise, generated in the system electronics in embodiments of the Present Invention is suppressed by lowering the non-white noise with synchronous phase detection and lowering the white noise by enabling reduced bandwidth in operation. In an optical system using the Present Invention, for example, background signals are immediately suppressed at the detector by common mode rejection and the detector system "tagging" each input component with +1 or −1 polarity flags as the signal enters the optical-to-electrical conversion process. The tagged signal components are then synchronized with a second stage of reverse electronic chopping and combined, thereby reestablishing and preserving the original input signal. In this reverse chopping stage, non-white random noise segments are cancelled and the overall electrical noise effectively attenuated. The simultaneous combination of full-signal non-white noise suppression by polarity coding, common mode rejection at the sense node and white noise reduction by narrow bandwidth has never been taught before. The preservation of the original input signal, while attenuating electronic noise, provides an exceptionally clear, relatively noise-free, visual image.

Embodiments of the Present Invention thus include an input signal chopping device to produce at least two input signal components, and at least two detectors or an alternating detector system with opposite polarities to detect the at least two dither chopped input signal components while simultaneously cancelling background signals common to the detectors. Differential signals from the at least two detectors or alternating detector system are then superimposed to create a single detector current signal. A preamplifier is provided to receive that single detector signal, followed by electronic switch means to flip polarity of detected current signal segments, thereby combining and reestablishing the original input. A low pass filter, an amplifier, and an analog-to-digital converter can also be added, resulting in a final digital detection signal.

BRIEF DESCRIPTION OF THE FIGURES

Features, aspects, and embodiments of the Present Invention are described in conjunction with the attached drawings, in which.

DETAILED DESCRIPTION OF THE PREFERRED EMBODIMENTS

While the Present Invention is susceptible of embodiments in many different forms, there is shown in the, drawings and will herein be described in detail, preferred embodiments of the Present Invention with the understanding that the present disclosure is to be considered as an exemplification of the principles of the Present Invention, and is not intended to limit the broad aspects of the Present Invention to the embodiments illustrated herein.

Figure 1:
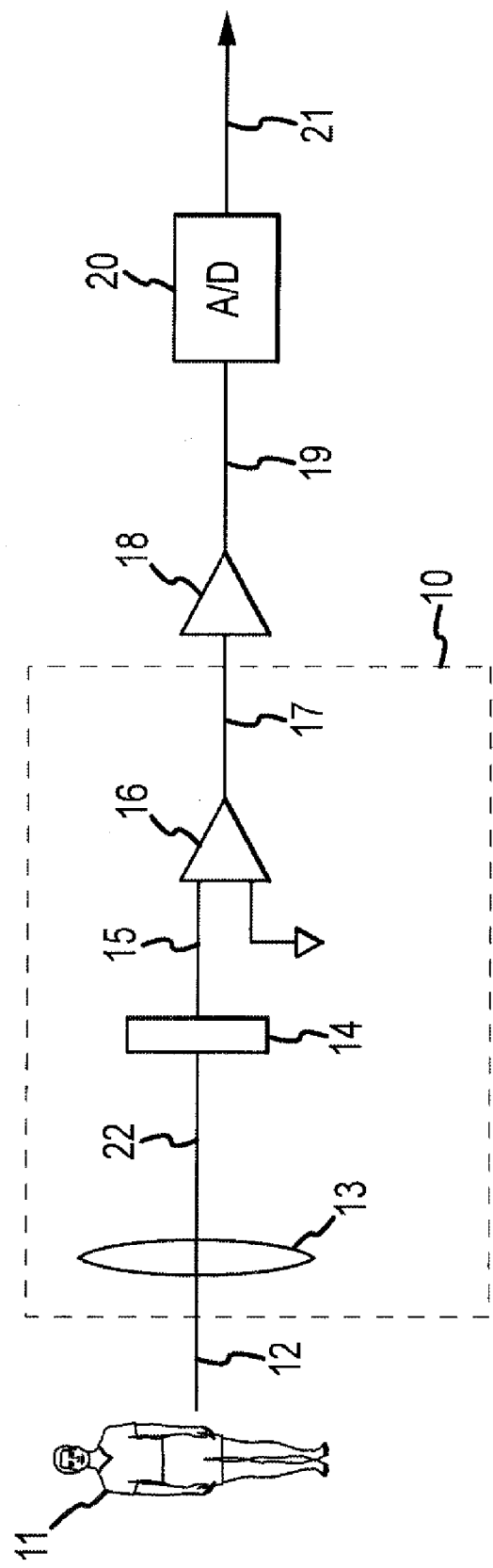
FIG. 1 is a diagram illustrating an exemplary prior art device, without the detection system of the Present Invention.

FIG. 1 is a diagram illustrating an exemplary optical detection device, as it may exist in the prior art. The image being detected is shown at 11, and the input signal from image 11 is represented by line 12. The input signal in this example is an optical signal and is received by optical lens 13. After exiting the lens, the input signal enters detector 14, exits detector 14 as electric analog detector signal 15, and enters preamplifier 16. Amplified signal 17 exits preamplifier 16 and enters amplifier 18, where the input signal is amplified again. Signal 19 exiting amplifier 18 then enters analog-to-digital converter 20, and exits as digital detected signal 21. Digital detected signal 21 is then processed in any of the methods well-known in the art.

The electronic noise that is addressed by the Present Invention is created at and between detector 14 and preamplifier 16, when the input signal is converted into an electrical form. Accordingly, the system of the Present Invention replaces the detector and preamplifier configuration of the currently-known devices. More specifically, the components within the box labeled 10 in FIG. 1 are replaced by components forming part of the Present Invention.

Figure 2A:
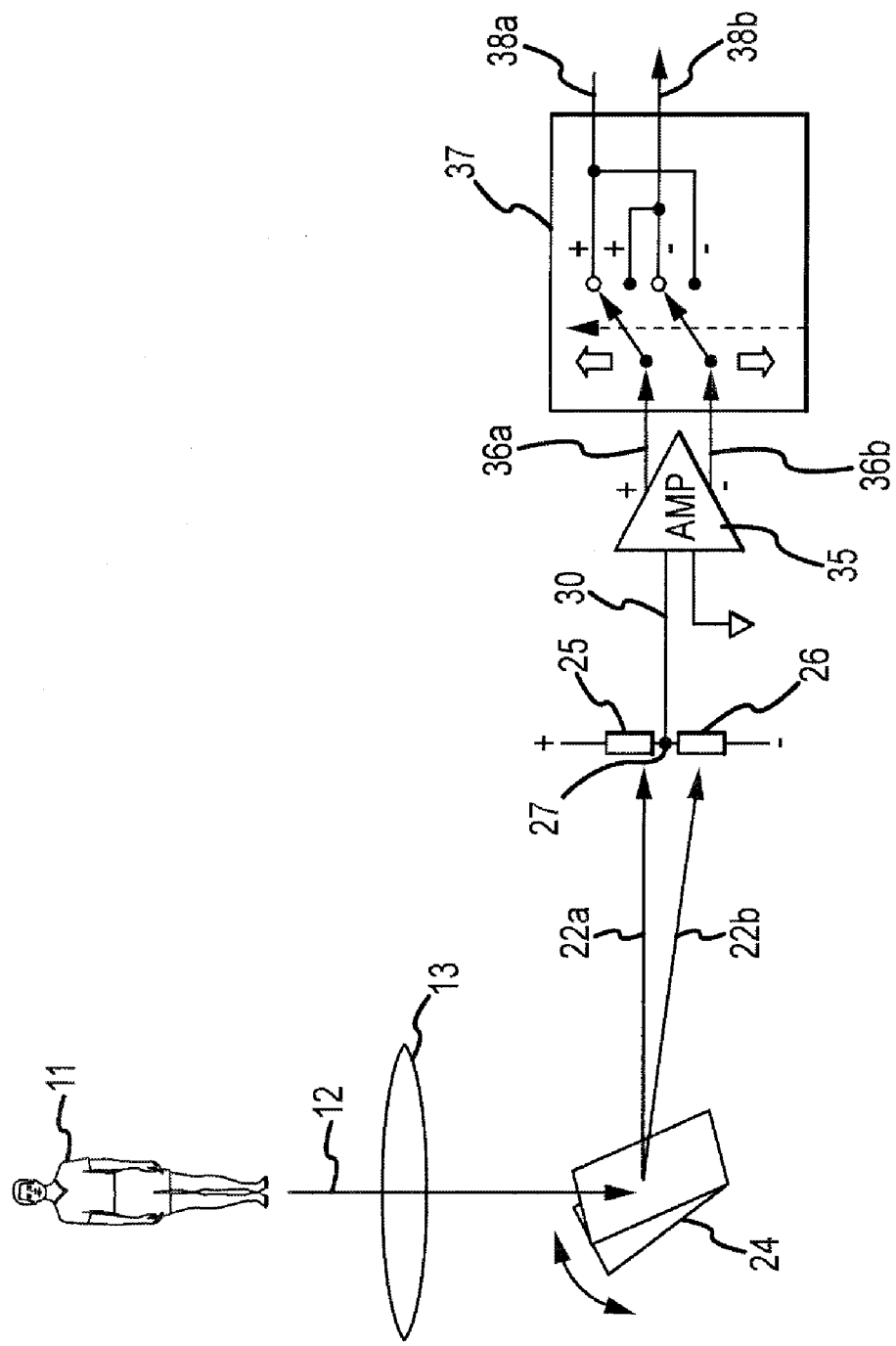
FIG. 2A is a diagram illustrating a portion of an optical embodiment of the Present Invention.
Figure 2B:
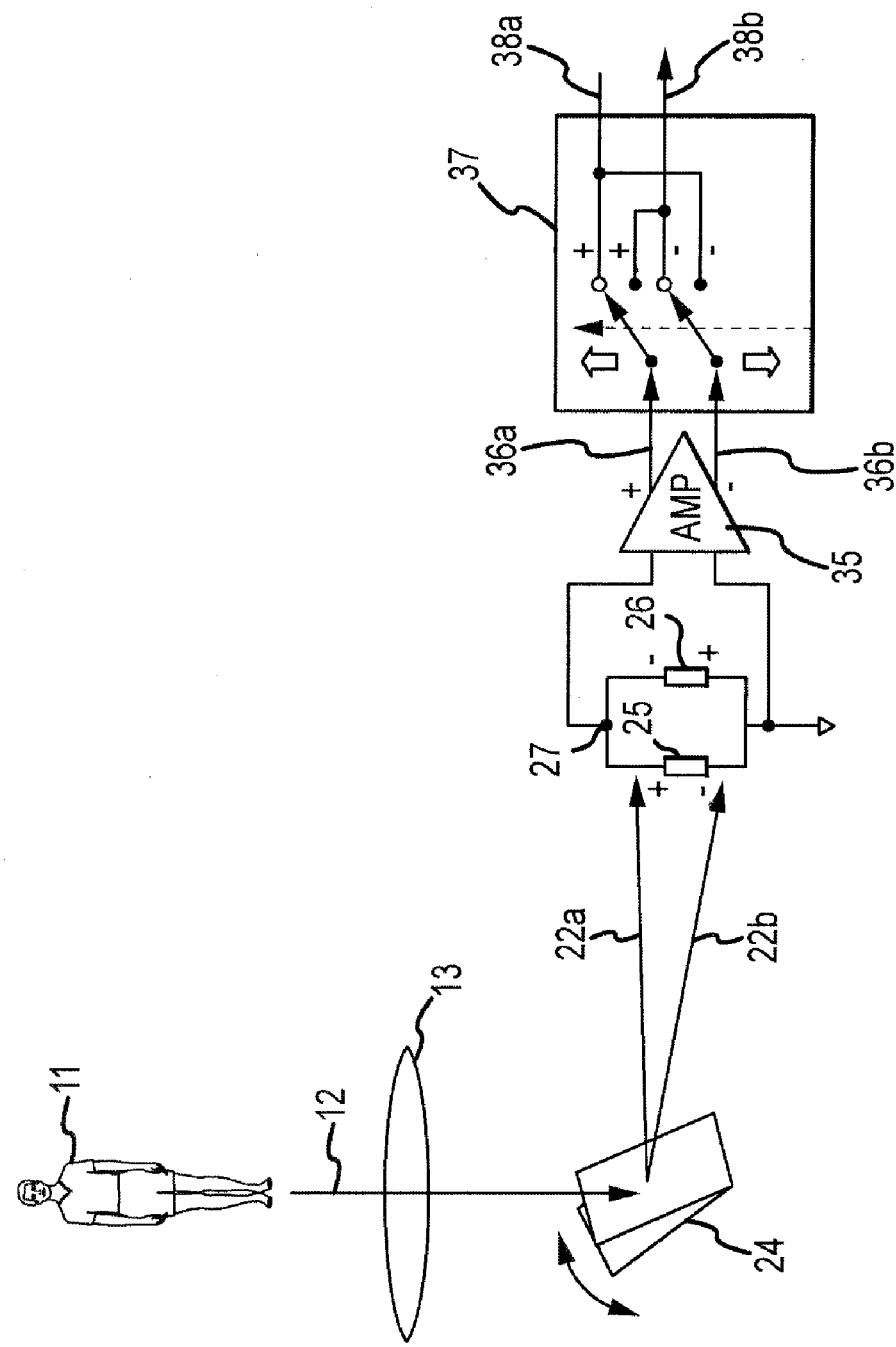
FIG. 2B is a diagram illustrating an alternative photovoltaic arrangement for the sensors and amplifier shown in FIG. 2A.

FIGS. 2A and 2B illustrate components of embodiments of the Present Invention in which there is shown an optical system, such as could be used for night vision binoculars or a low light camera. It is recognized, however, that the Present Invention can also be used for other systems, such as those based upon vibration, sound, heat, pressure or the like.

Figure 3:
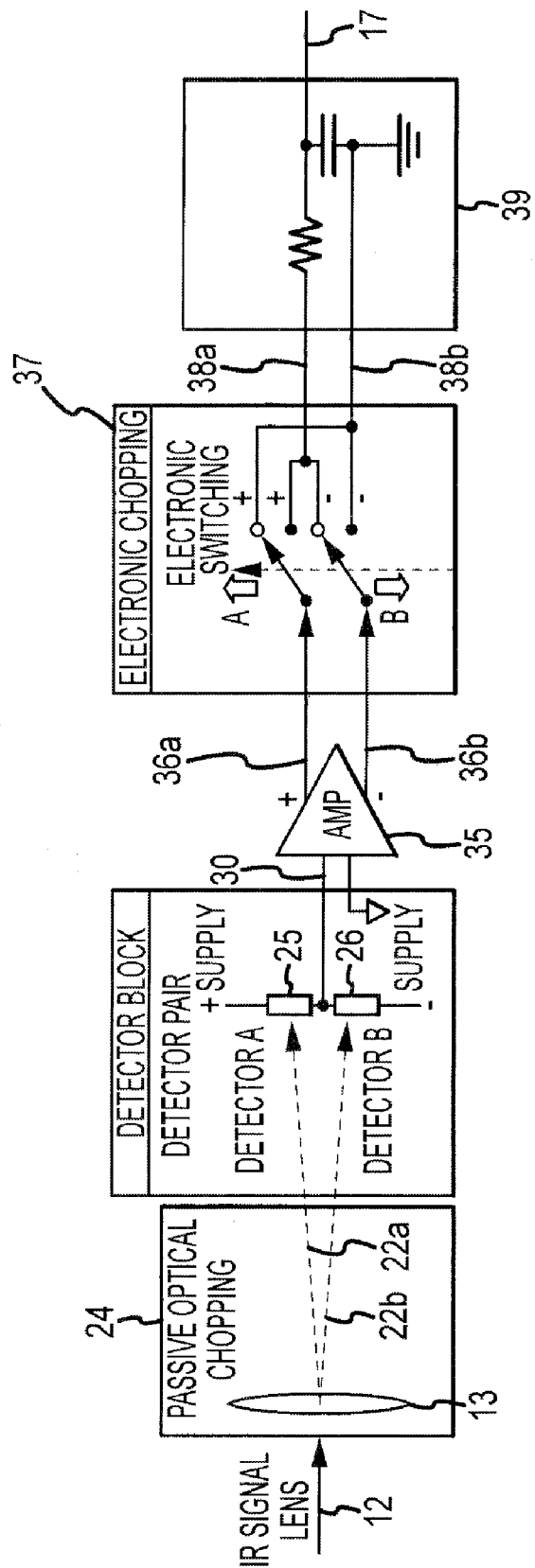
FIG. 3 is another diagram illustrating further portions of the optical embodiment of the Present Invention.

In FIGS. 2A and 3, which illustrate different details and representations of the Present Invention, the image being detected is again shown at 11, as in FIG. 1, with an input signal shown at 12, and an optical lens shown at 13. There is then provided a method for splitting or dither chopping the input signal into two separate signals directed to two separate detectors. As shown in FIG. 2A, a method for dither chopping the input signal is accomplished by a physical beam steering system (alternatively, any beam shift solution may be used to achieve the same end). In particular, the input signal exiting the lens is split into two separate time division multiplexed components, 22a and 22b, by a micromirror array, a single mirror of which is portrayed at 24 (see FIG. 5). In one embodiment of the Present Invention the micromirror array is a magnetic chopper steering mirror such as from Sutech Optical Model SF800M (see, www.sutechoptical.com). In another embodiment, the micromirror array is a fast steering mirror such as from Newport (see, www.newport.com/Fast-Steering-Mirrors/144996/1033/catalog.aspx).

The separate time division multiplexed components 22a and 22b are then directed to and enter two detectors 25 and 26.

In FIG. 2A the two detectors are shown in a serial arrangement, having a bias on the detectors. FIG. 2B shows an alternative arrangement of the detectors 25 and 26, shown in a parallel configuration without any bias. Alternatively, for a single point source, one can have a single signal with a modulating dual detector block, or for a larger image, a microlens array focusing the image and a modulating dual detector block, also dither chopping the signal. Additionally, dither chopping of the input signal may be accomplished by other means, including those that do not have moving parts. An example may be the use of refractive index steering (birefringent properties) as taught in telecommunications applications.

Detectors 25, 26 shown in FIG. 2A have inverse polarities, such that opposite outputs are provided from each detector 25, 26 at any single point in time. That is, a positive polarity output will exist at one detector when a negative polarity output exists at the other detector. Such opposite polarities may be established by the position of the detector in the circuit, or by the inherent properties of the detector. For example, when using a resistive type detector (e.g., a thermistor, a sensor that changes resistance with changes in temperature), the polarity of the sensor is established by its position in relation to the power supply. The orientation of the sensors in use is not significant. When using a polarity sensitive detector (e.g., a PZT or electret microphone, having a fixed internal voltage and polarity), on the other hand, the polarity is established by the internal voltage of the sensor. When a polarity sensitive detector is used, it must be connected to the appropriate polarity of the power supply. The complementary power supply voltages are then set to produce a null at the junction of the voltage divider at sense node 27. This configuration effectively "tags" each multiplexed input signal component with a +1 or −1 polarity, depending on the detector that is sensing the signal.

The Present Invention is not dependent on the specific type of detectors that are used. Detectors can range from visible to longwave infrared detectors, visible light detectors such as UDT Sensors CD-1705 silicon PiN photodectors, to long wave infrared detectors such as from Infrared Associates, Inc., Type MCT-13 HgCdTe LWIR. Other detector families, including InGaAs and InSb detectors, can also be used.

As shown in FIG. 2A or 2B and 3, detector 25, at the designated point in time, is shown as providing a positive signal, and detector 26 is shown as providing a negative signal. A sense node 27 provides a single combined output of the multiple detectors. Thus, after the input signal is split and each multiplexed component is directed to detector 25 or 26, as referenced above, each component will be tagged with a positive or negative polarity. For example, with an optical detector pair, a positive signal is provided when detector 25 senses one component of the multiplexed input light signal and a negative signal is provided when detector 26 senses the next time phased component of the input light signal. By having only a single sense node for the detector pair, any background light that is detected by both detectors at the same time will cancel each other out and result in a signal of zero background value.

An extremely fast and efficient dual optical detection circuit based upon a balanced, inverted parallel photodiode pair, known as an "opsistor," is shown and described in Chow et al., U.S. Pat. No. 5,838,995, entitled "Wavelength-Controllable Voltage-Phase Photodiode Optoelectronic Switch," which is incorporated herein by reference. The opsistor, photodiode pair is based upon a photovoltaic arrangement. A photoconductive arrangement with bias can also be used, as is well known in the art.

Figure 5:
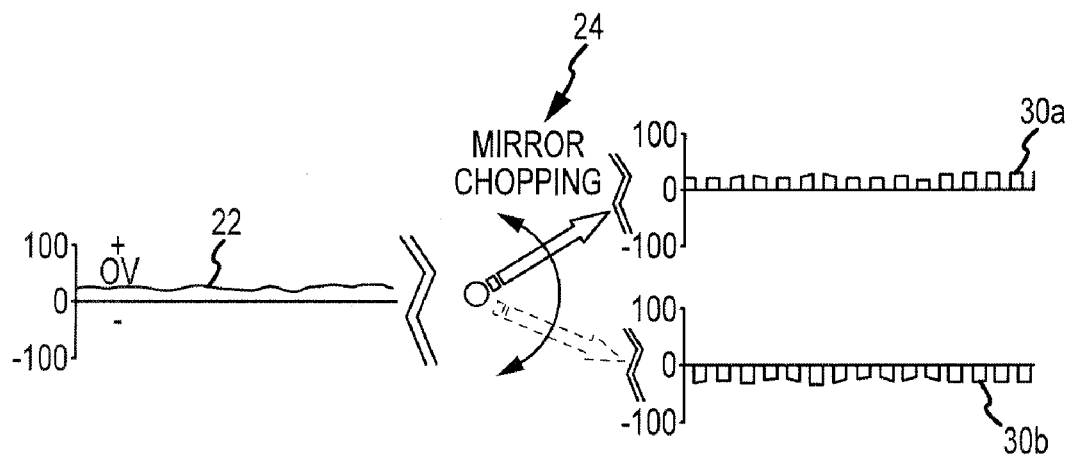
FIG. 5 is a schematic representation of the optical embodiment of the Present Invention showing the original input signal and the resulting electrical components of that signal after the first chopping stage has been completed.

FIG. 5 illustrates the physical chopping procedure and the electrical "tagged" signal that results after exiting the detector pair. The optical input signal is shown at 12. The physical mirror chopping, as described above, is schematically represented at 14. The two chopped components resulting from electronic tagging are graphically portrayed, with signal 30a representing the tagged positive signal from detector 25 (not illustrated), and signal 30b representing the tagged negative signal from detector 26 (not illustrated).

Figure 4:
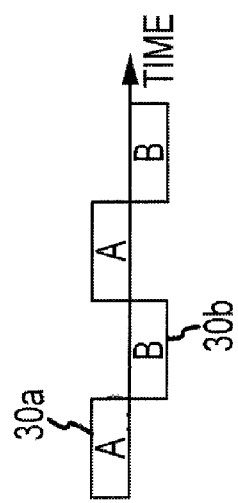
FIG. 4 is a diagram showing a portion of the signal created after the detectors and before the second electronic chopping stage in one embodiment of the Present Invention.

The resulting signal 30 from the detector pair shown in FIGS. 2 and 3 is the superimposition of tagged signals 30a, 30b, as shown in FIG. 4, plus any noise that is created in the detector and amplifier as the input signal is converted to an electrical signal. As is seen, and a part of the innovation of the Present Invention, the dual detector arrangement provides two paths for injecting the input signal into a detection circuit, but only one noise waveform with which to contend. In other words, the physical chopping and tagging that is performed is only performed on the input signal, and any noise, which is added on signal 30, is not chopped or tagged. This will allow for identification of the tagged signal and filtered attenuation of the untagged noise.

As further shown in FIGS. 2 and 3, the resulting electrical signal 30 is amplified in amplifier 35, with balanced output, as is well known in the art. Exiting amplifier 35 are balanced outputs 36a, 36b. These outputs enter switching network 37, which provides a second, electrical chopping or "reverse" chopping process. This second chopping process is synchronized to the first dithering chopping frequency, whereby the dithered positive signals are passed and the dithered negative signals are inverted. That is, there is a fundamental two-step sequence. First, the input signal is coded with a +1 and −1 polarity factor as it enters the electrical domain consisting of the detector and preamplifier circuit. Second, inside the electrical domain, a second stage of electronic chopping with +1 and −1 multipliers is synchronously phase-locked in the input signal dither chopping. The optimum frequency of the system chopping rates (e.g., of the chopping rates of both chopping steps), can be varied, but must be greater than the expected target signal bandwidth (e.g., the rate that the target signal is expected to change). A preferred chopping rate is approximately Ten (10) times the maximum expected target signal bandwidth (i.e., a detector system with 30 frame/sec response will use a chopping rate around 300 Hz). In this manner, much of the quasi-DC noise on the signal, which was not chopped, will cancel itself out when passing through the switching network while white noise is attenuated by reduced bandwidth. The reverse chopped signals exiting this second electronic chopping circuit are shown at 38a and 38b.

Figure 6:
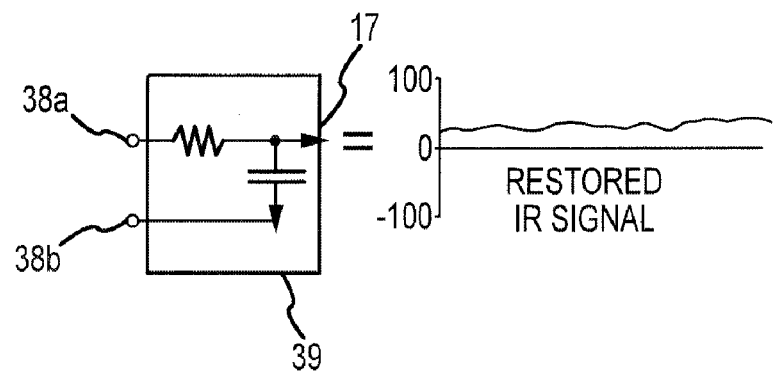
FIG. 6 is a schematic representation of a low pass filter and restored input signal from one embodiment of the Present Invention.

Reverse chopped signals 38a, 38b enter low pass filter 39, as illustrated in FIG. 6. Low pass filter 39 passes the low frequency input signal and filters out any remaining high frequency noise. Exiting low pass filter 39 is the final restored input signal, also shown in FIG. 6, which corresponds to a relatively noise-free signal 17 that can be input to amplifier 18 and analog-to-digital converter 20, as shown in the remaining system illustrated in FIG. 1.

The disclosed Present Invention provides a system and method for attenuating electrical noise. It should be noted that the above-described and illustrated embodiments and preferred embodiments of the Present Invention are not an exhaustive listing of the form the Present Invention might take; rather, they serve as exemplary and illustrative of embodiments of the Present Invention as presently understood. Many other forms of the Present Invention exist and are readily apparent to one having ordinary skill in the art.

What is claimed is:

1. A system for attenuating electrical noise, the system comprising:
 a lens;
 an input device for receiving an input image signal after passing through said lens;
 a first chopping device for splitting said received input signal into two separate time-phased input signals;
 two detectors of opposite polarity, each detector receiving one of said two separate time-phased input signals and providing an electric current output signal;
 a first superimposing device to superimpose the two electric current output signals and forming a single detected signal;
 a preamplifier, having at least two inputs and an output, with the preamplifier inputs receiving a reference signal and the single detected signal;
 a second chopping device, synchronized to said first chopping device, for providing normal and inverted amplification signals; and
 a second superimposing device to superimpose said normal and inverted amplification signals and provide a superimposed and restored input signal.

2. The system of claim 1, wherein the second chopping device reverses the polarity of selected portions of the preamplifier output signal.

3. The system of claim 2, wherein the input image signal is an optical signal.

4. The system of claim 2, wherein the input signal is split into at least two separate time division multiplexed components.

5. The system of claim 2, wherein the input signal is split according to a first chopping frequency.

6. The system of claim 5, wherein the reverse chopping is synchronized to the first chopping frequency, whereby chopped positive signals are passed and chopped negative signals are inverted.

7. The system of claim 1, wherein the input image signal is an optical signal.

8. The system of claim 7, wherein the input image signal is one of vibration.

9. The system of claim 1, wherein the input image signal is one of a magnetic field.

10. The system of claim 1, wherein the input image signal is one of sound.

11. The system of claim 1, wherein the input image signal is one of heat.

12. The system of claim 1, wherein the input image signal is one of pressure.

13. A system for attenuating electrical noise, the system comprising:
 a lens;
 an input device for receiving an input image signal after passing through said lens;
 a chopping device splitting said received signal into two separate input signals;
 two detectors of opposite polarity, each detector receiving one of said two separate input signals; and
 an output to each of said two detectors, each output of each detector joined and having only a single sense node between the two detector outputs, establishing a single dual detector output signal.

14. A method of improving signal-to-noise ratio, the method comprising:
 receiving an input image signal through a lens;
 splitting the input signal after exiting said lens into two components;
 and applying a reverse polarity on each split input signal component;
 superimposing the two reverse polarity input signal components into a superimposed signal;
 amplifying the superimposed signal;
 receiving and reverse chopping the superimposed signal, providing normal and inverted amplification signals; and
 superimposing the normal and inverted amplification signals into a restored signal.

15. The method of claim 14, wherein the receiving and reverse chopping step reverses the polarity of selected portions of the amplified output signal.

16. The method of claim 15, wherein the input image signal is an optical signal.

17. The method of claim 15, wherein the input signal is split into at least two separate time division multiplexed components.

18. The method of claim 15, wherein the input signal is split according to a first chopping frequency.

19. The method of claim 18, wherein the reverse chopping is synchronized to the first chopping frequency, whereby chopped positive signals are passed and chopped negative signals are inverted.

20. The method of claim 14, wherein the input image signal is an optical signal.

21. The method of claim 14, wherein the input image signal is one of vibration.

22. The method of claim 14, wherein the input image signal is one of a magnetic field.

23. The method of claim 14, wherein the input image signal is one of sound.

24. The method of claim 14, wherein the input image signal is one of heat.

25. The method of claim 14, wherein the input image signal is one of pressure.

* * * * *